(12) United States Patent
Zehnder et al.

(10) Patent No.: US 7,147,712 B2
(45) Date of Patent: Dec. 12, 2006

(54) METHOD OF SEMICONDUCTOR NANOPARTICLE SYNTHESIS

(75) Inventors: Donald A. Zehnder, San Carlos, CA (US); Joseph A. Treadway, Fremont, CA (US)

(73) Assignee: Invitrogen Corporation, Carlsbad, CA (US)

( * ) Notice: Subject to any disclaimer, the term of this patent is extended or adjusted under 35 U.S.C. 154(b) by 255 days.

(21) Appl. No.: 10/263,366

(22) Filed: Oct. 1, 2002

(65) Prior Publication Data

US 2003/0097976 A1    May 29, 2003

Related U.S. Application Data

(60) Provisional application No. 60/404,628, filed on Aug. 19, 2002, provisional application No. 60/401,671, filed on Aug. 6, 2002, provisional application No. 60/326,746, filed on Oct. 2, 2001.

(51) Int. Cl.
*C30B 7/00* (2006.01)

(52) U.S. Cl. ............................ 117/68; 117/69; 117/955; 117/956; 117/957; 117/959; 422/245.1

(58) Field of Classification Search .................. 117/68, 117/69, 955, 956, 957, 959; 422/245.1
See application file for complete search history.

(56) References Cited

U.S. PATENT DOCUMENTS

| | | | |
|---|---|---|---|
| 5,747,180 A * | 5/1998 | Miller et al. ................. | 428/601 |
| 5,811,575 A * | 9/1998 | Kleiner et al. .................. | 562/8 |
| 6,179,912 B1 * | 1/2001 | Barbera-Guillem et al. .. | 117/68 |
| 6,207,229 B1 | 3/2001 | Bawendi et al. | |
| 6,225,198 B1 | 5/2001 | Alivisatos et al. | |
| 6,322,901 B1 | 11/2001 | Bawendi et al. | |
| 6,682,596 B1 * | 1/2004 | Zehnder et al. ................ | 117/68 |
| 2002/0066401 A1 | 6/2002 | Peng et al. | |
| 2002/0071952 A1 | 6/2002 | Bawendi et al. | |
| 2004/0108209 A1 * | 6/2004 | Herbert et al. .............. | 204/548 |

FOREIGN PATENT DOCUMENTS

| WO | WO 02/29140 A1 | 4/2002 |
|---|---|---|
| WO | WO 02/053810 A1 | 7/2002 |

OTHER PUBLICATIONS

Dabbousi et al. (1997), "(CdSe)ZnS Core-Shell Quantum Dots: Synthesis and Characterization of a Size Series of Highly Luminescent Nanocrystallites," *J. Phys. Chem. B* 101(46):9463-9475.

Ekimov et al. (1981), "Quantum Size Effect in Three-Dimensional Microscopic Semiconductor Crystals," *JETP Letters* 34(6):345-349.

Fojtiket al. (1984), "Photo-Chemistry of Colloidal Metal Sulfides 8. Photo-Physics of Extremely Small CdS Particles: Q-State CdS and Magic Agglomeration Numbers," *Ber. Bunsenges. Phys. Chem.* 88:969-977.

Hines et al. (1996), "Synthesis and Characterization of Strongly Luminescing ZnS-Capped CdSe Nanocrystals," *J. Phys. Chem.* 100(2):468-471.

(Continued)

*Primary Examiner*—Yogendra N. Gupta
*Assistant Examiner*—Matthew J. Song
(74) *Attorney, Agent, or Firm*—Pepper Hamilton, LLP

(57) ABSTRACT

A method is described for the manufacture of semiconductor nanoparticles. Improved yields are obtained by use of a reducing agent or oxygen reaction promoter.

37 Claims, 5 Drawing Sheets

OTHER PUBLICATIONS

Katari et al. (1994), "X-ray Photoelectron Spectroscopy of CdSe Nanocrystals with Applications to Studies of the Nanocrystal Surface," *J. Phys. Chem.* 98(15):4109-4117.

Kosolapoff (1945), "Isomerization of Alkylphosphites. III. The Synthesis of *n*-Alkylphosphonic Acids," *J. Am. Chem. Soc.* 67:1180-1182.

Kuno et al. (1997), "The Band Edge Luminescence of Surface Modified CdSe Nanocrystallites: Probing the Luminescing State," *J. Chem. Phys.* 106(23):9869-9882.

Meyer et al. (1984), "Photosensitized Charge Separation and Hydrogen Production in Reversed Micelle Entrapped Platinized Colloidal Cadmium Sulphide," *J. Chem. Society, Chemical Communications* 90:90-91.

Murray et al. (1993), "Synthesis and Characterization of Nearly Monodisperse CdE (E=S, Se, Te) Semiconductor Nanocrystallites," *J. Am. Chem. Soc.* 115(19):8706-8715.

Peng et al. (1997), "Epitaxial Growth of Highly Luminescent CdSe/CdS Core/Shell Nanocrystals with Photostability and Electronic Accessibility," *J. Am. Chem. Soc.* 119(30):7019-7029.

Peng et al. (1998), "Kinetics of II-VI and III-V Colloidal Semiconductor Nanocrystal Growth: 'Focusing' of Size Distributions," *J. Am. Chem. Soc.* 120(21):5343-5344.

Peng et al. (2001), "Formation of High-Quality CdTe, CdSe, and CdS Nanocrystals Using CdO as Precursor," *J. Am. Chem. Soc.* 123(1):183-184.

Peng et al. (2001), "Mechanisms of the Shape Evolution of CdSe Nanocrystals," *J. Am. Chem. Soc.* 123(7):1389-1395.

Qu et al. (2001), "Alternative Routes Toward High Quality CdSe Nanocrystals," *Nano Letters* 1(6):333-337.

Qu et al. (2002), "Control of Photoluminescence Properties of CdSe Nanocrystals in Growth," *J. Am. Chem. Soc.* 124(9):2049-2055.

\* cited by examiner

METHOD OF SEMICONDUCTOR NANOPARTICLE SYNTHESIS

CROSS REFERENCE TO RELATED APPLICATIONS

This application claims priority under 35 U.S.C. § 119(e)(1) to U.S. Provisional Application Ser. No. 60/326,746, filed Oct. 2, 2001; U.S. Provisional Application Ser. No. 60/401,671, filed Aug. 6, 2002; and U.S. Provisional Application Ser. No. 60/404,628, filed Aug. 19, 2002; the disclosures of which are incorporated by reference herein in their entireties.

FIELD OF THE INVENTION

This invention relates to nanoparticles. More particularly, the invention relates to methods for making and using semiconductor nanoparticles. The invention finds utility in a variety of fields, including biology, analytical and combinatorial chemistry, medical diagnostics, and genetic analysis.

BACKGROUND OF THE INVENTION

Semiconductor nanocrystals (also known as quantum dot particles) whose radii are smaller than the bulk exciton Bohr radius constitute a class of materials intermediate between molecular and bulk forms of matter. Quantum confinement of both the electron and hole in all three dimensions leads to an increase in the effective band gap of the material with decreasing crystallite size. Consequently, both the optical absorption and emission of semiconductor nanocrystals shift to the blue (higher energies) as the size of the nanocrystals gets smaller.

Semiconductor nanocrystals are nanoparticles composed of an inorganic, crystalline semiconductive material and have unique photophysical, photochemical and nonlinear optical properties arising from quantum size effects, and have therefore attracted a great deal of attention for their potential applicability in a variety of contexts, e.g., as detectable labels in biological applications, and as useful materials in the areas of photocatalysis, charge transfer devices, and analytical chemistry. As a result of the increasing interest in semiconductor nanocrystals, there is now a fairly substantial body of literature pertaining to methods for manufacturing such nanocrystals.

In general, these routes can be classified as involving preparation in glasses (Ekimov et al., *JETP Letters* 34:345 (1981)); aqueous preparation, including preparations that involve use of inverse micelles, zeolites, Langmuir-Blodgett films, and chelating polymers (Fendler et al., *J. Chem. Society, Chemical Communications* 90:90 (1984) and Henglein et al., *Ber. Bunsenges. Phys. Chem.* 88:969 (1984)); and high temperature pyrolysis of organometallic semiconductor precursor materials, i.e., rapid injection of precursors into a hot coordinating solvent (Murray et al., *J. Am. Chem. Soc.* 115:8706 (1993) and Katari et al., *J. Phys. Chem.* 98:4109 (1994)). The two former methods yield particles that have unacceptably low quantum yields for most applications, a high degree of polydispersity, poor colloidal stability, a high degree of internal defects, and poorly passivated surface trap sites. In addition, nanocrystals made by the first route are physically confined to a glass matrix and cannot be further processed after synthesis.

Improved synthesis conditions have been reported that utilize cadmium salts (Peng, et al., *J. Am. Chem. Soc.* 123:183–184 (2001)). These conditions provide certain advantages over the rapid injection method. The use of cadmium acetate, cadmium oxide or other such Cd(II) salts, pre-complexed with a ligand such as tetradecylphosphonic acid provides for a cadmium precursor that is particularly suitable for nanocrystal synthesis. These reactions have numerous desirable features, including improved safety and relatively wide tolerance for production variables such as precursor injection rate and temperature. Of particular note is that these reactions can be tuned to yield very narrow photoluminescence spectra over a wide range of useful wavelengths. Unfortunately, it is difficult to optimize the particle yield, while maintaining the desirable features of the Cd(II) synthesis conditions. In particular, for smaller size nanoparticle synthesis, yields have been very poor under Cd(II) synthesis conditions. Reaction conditions that provide such low yields are not only more expensive to implement on a manufacturing scale, but they often require much larger reactors and produce more hazardous waste.

Thus, there remains a need in the art for improved methods for manufacturing nanoparticles, and smaller nanoparticles in particular. Such methods would ideally provide a high product yield of internally defect free, high band edge luminescence nanoparticles with no or minimal trapped emission. Such methods would also ideally provide for the manufacture of particles that exhibit near monodispersity and have a relatively narrow particle size distribution. Finally, such methods would be useful not only with semiconductor nanoparticles, but also with other types of nanoparticles, e.g., semiconductive nanoparticles that are not necessarily crystalline and metallic nanoparticles.

The present invention addresses those needs by providing improved methods for manufacturing nanoparticles. By controlling the nucleation density the methods of the invention provide for a predictable and controllable final particle size, as well as many of the aforementioned properties.

SUMMARY OF THE INVENTION

One aspect of the invention relates to a method of producing nanoparticles comprising: (a) mixing a first precursor and at least one coordinating solvent to form a first mixture; (b) exposing the first mixture to a reaction promoter selected from the group consisting of oxygen and a reducing agent; (c) heating the first mixture to a temperature that is sufficiently high to form nanoparticles (nucleation crystals) when a second precursor is added; (d) introducing a second precursor into the first mixture to form a second mixture thereby resulting in the formation of a plurality of nanoparticles; and (e) cooling the second mixture to stop further growth of the nanoparticles.

Another embodiment of the invention is a method of producing nanoparticles comprising: (a) mixing a first precursor and a second precursor with at least one coordinating solvent to form a first mixture; (b) heating the first mixture to a temperature that is sufficiently high to form nanoparticles when a reaction promoter is added; (c) exposing the first mixture to a reaction promoter, the reaction promoter being selected from the group consisting of oxygen and a reducing agent, to form a second mixture thereby resulting in the formation of a plurality of nanoparticles; and (d) cooling the second mixture to stop further growth of the nanoparticles.

Yet another embodiment of the invention is a method of producing the nanoparticle shell comprising (a) mixing nanoparticles with at least one coordinating solvent to form a first mixture; (b) heating the first mixture to a temperature that is sufficiently high to form a shell on the nanoparticles when first and second precursors are added; (c) introducing first and second precursors into the first mixture to form a second mixture thereby resulting in the formation of shells on a plurality of nanoparticles; and (d) cooling the second mixture to stop further growth of the shell; wherein the method further comprises exposing the first or second mixture to a reaction promoter selected from the group consisting of oxygen and a reducing agent. The nanoparticles can be produced by the methods described herein or can be produced by any method known in the art.

Another aspect of the invention pertains to a method of producing semiconductive nanoparticles having a valency "n", comprising: (a) mixing a first precursor having a valency "c" and at least one coordinating solvent to form a mixture; (b) exposing the mixture to a reaction promoter wherein the reaction promoter converts the valency of the first precursor to a valency "a"; (c) heating the mixture to a temperature that is sufficiently high to form nanoparticles when a second precursor is added; (d) introducing a second precursors into the mixture to form a second mixture thereby resulting in the formation of a plurality of nanoparticles; wherein the second precursor has a valency "b", and wherein a+b=n and c+b≠n; and (e) cooling the second mixture to stop further growth of the nanoparticles.

BRIEF DESCRIPTION OF THE DRAWINGS

FIG. 1 shows the effect on emission peak wavelength, while FIG. 2 shows the effect on the full peak width at half maximum (FWHM).

DETAILED DESCRIPTION OF THE INVENTION

Figure 1:
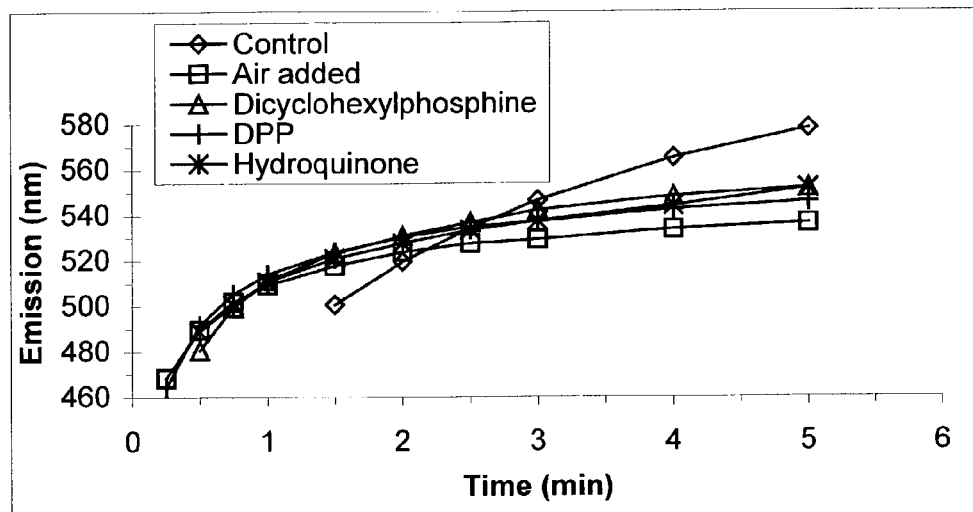
FIG. 1 and FIG. 2 are graphical representations of the effect on temporal wavelength evolution during the course of a CdSe nanocrystal core-forming reaction as a function of added reaction promoter, as described in Examples 1 and 2.

The present invention provides an improved method of producing nanoparticles having a means for controlling the reactivity of a solution of nanoparticle precursors through introduction of a reaction promoter prior to the nucleation of nanoparticles. This control of reactivity allows for control of the relative number of nanoparticle nuclei formed in a single nucleation period. Control of nucleation density provides for a predictable and controllable final nanoparticle size, size distribution and yield. In addition, the method also provides for control of the growth rate once nucleation occurs, which allows for control of size focusing, resulting in very narrow size distributions. The methods described herein can be used to form the nanoparticle core, the nanoparticle shell, or both. In addition, the methods described herein can be used to form nanoparticles that are smaller than has been possible using traditional methods known in the art, e.g., for preparing CdSe nanoparticles which emit with an emission maximum in the range of 400 nm to 500 nm.

In general, the invention provides a method of producing nanoparticles by contacting a first precursor M' (valency=c) with a reaction promoter, wherein the reaction promoter converts M' to M (valency=a); and then contacting the M precursor with a second precursor X (valency=b) to produce nanoparticles having a valency "n", wherein c+b≠n and a+b=n.

Either the first elemental component or the second elemental component of the nanoparticle can gain electrons. Therefore, the resulting nanoparticle can have a composition of MX or XM, as exemplified below. For example, the method of the invention can be used for the production of CdSe nanoparticles, i.e., MX nanoparticles where n=0. The first precursor M' can be $Cd^{+2}$ ($c=^{+}2$). Upon reaction with a reaction promoter of the invention, such as DPP or hydroquinone, $Cd^{+2}$ is converted or reduced to $Cd^0$ (M, where a=0). This is then contacted with the second precursor $Se^0$ (X, where b=0) to produce the CdSe nanoparticles having a valency of 0.

$Cd^{+2}$+reaction promoter→$Cd^0$ $Cd^0$+$Se^0$→CdSe

The method of the invention can also be used for the production of, for example, InP nanoparticles, i.e., XM nanoparticles where n=0. The first precursor M' can be $P^0$ (c=0). Upon reaction with a reaction promoter of the invention, such as DPP or hydroquinone, $P^0$ is converted or reduced to $P^{-3}$ (M, where a=−3). This is then contacted with the second precursor $In^{+3}$ (X, where b=$^{+}$3) to produce the InP nanoparticles having a valency of 0.

$P^0$+reaction promoter→$P^{-3}$ $In^{+3}$+$P^{-3}$→InP

Accordingly, one embodiment of the invention is a method of producing semiconductive nanoparticles having a valency "n", comprising: (a) mixing a first precursor having a valency "c" and at least one coordinating solvent to form a first mixture; (b) exposing the first mixture to a reaction promoter wherein the reaction promoter converts the valency of the first precursor to a valency "a"; (c) heating the first mixture to a temperature that is sufficiently high to form nanoparticles when a second precursor is added; (d) introducing a second precursor into the mixture to form a second mixture thereby resulting in the formation of a plurality of nanoparticles; wherein the second precursor has a valency "b", and wherein a+b=n and c+b≠n; and (e) cooling the second mixture to stop further growth of the nanoparticles.

More specifically, in one embodiment of the invention, the method of producing nanoparticles is a one-pot synthesis technique that involves: (a) mixing a first precursor, an optional ligand and at least one coordinating solvent to form a first mixture; (b) exposing the first mixture to a reaction promoter; (c) heating the first mixture to a temperature that is sufficiently high to form nanoparticles, i.e., nucleation crystals, when a second precursor is added; (d) introducing a second precursor into the first mixture to form a second mixture thereby resulting in the formation of a plurality of nanoparticles; and (e) cooling the second mixture to stop further growth of the nanoparticles. A reducing agent or oxygen source serves as the reaction promoter.

The exposure to a reaction promoter provides for a higher yield of nanoparticles, typically up to three times more yield, more preferably up to 19 times better yield when compared to those methods where no reaction promoter is used. In addition, the nanoparticle yield can be modulated by modulating the amount of reaction promoter added for the length of time of exposure.

The methods described herein can provide nanoparticles having an average particle diameter within the range of about 1.5 to 15 Å, with a particle size deviation of less that about 10% rms in diameter.

The methods described herein are particularly useful for preparing a monodisperse population of CdSe nanoparticles having an emission peak wavelength that is preferably less than about 570 nm, preferably less than about 520 nm, more preferably less than about 500 nm.

In addition, the methods described herein can provide a monodisperse population of nanoparticles having an emission peak wavelength that is less than about 35 nm at full width at half max (FWHM), preferably less than about 30 nm FWHM, more preferably less than about 25 nm FWHM.

I. Definitions and Nomenclature

Before describing detailed embodiments of the invention, it is to be understood that unless otherwise indicated, this invention is not limited to specific nanoparticle materials or manufacturing processes, as such may vary. It may be useful to set forth definitions that are used in describing the invention. The definitions set forth apply only to the terms as they are used in this patent and may not be applicable to the same terms as used elsewhere, for example in scientific literature or other patents or applications including other applications by these inventors or assigned to common owners. The following description of the preferred embodiments and examples are provided by way of explanation and illustration, and is not intended to be limiting.

It must be noted that, as used in this specification and the appended claims, the singular forms "a", "an" and "the" include plural referents unless the context clearly dictates otherwise. Thus, for example, reference to "a nanoparticle" includes a single nanoparticle as well as two or more nanoparticles, and the like.

In describing and claiming the present invention, the following terminology will be used in accordance with the definitions set out below.

The term "nanoparticle" refers to a particle, generally a semiconductive particle, having a diameter in the range of about 1–1000 nm, preferably in the range of about 2–50 nm, more preferably in the range of about 2–20 nm.

The terms "semiconductor nanoparticle" and "semiconductive nanoparticle" refer to a nanoparticle as defined herein, that is composed of an inorganic semiconductive material, an alloy or other mixture of inorganic semiconductive materials, an organic semiconductive material, or an inorganic or organic semiconductive core contained within one or more semiconductive overcoat layers.

The terms "semiconductor nanocrystal," "quantum dot" and "Qdot™ nanocrystal" are used interchangeably herein to refer to semiconductor nanoparticles composed of an inorganic crystalline material that is luminescent (i.e., they are capable of emitting electromagnetic radiation upon excitation), and include an inner core of one or more first semiconductor materials that is optionally contained within an overcoating or "shell" of a second inorganic material. A semiconductor nanocrystal core surrounded by an inorganic shell is referred to as a "core/shell" semiconductor nanocrystal. The surrounding shell material will preferably have a bandgap energy that is larger than the bandgap energy of the core material and may be chosen to have an atomic spacing close to that of the core substrate.

The term "solid solution" is used herein to refer to a compositional variation that is the result of the replacement of ions or ionic groups with other ions or ionic groups, e.g., CdS in which some of the Cd atoms have been replaced with Zn. This is in contrast to a "mixture," a subset of which is an "alloy," which is used herein to refer to a class of matter with definite properties whose members are composed of two or more substances, each retaining its own identifying properties.

By "luminescence" is meant the process of emitting electromagnetic radiation (light) from an object. Luminescence results when a system undergoes a transition from an excited state to a lower energy state with a corresponding release of energy in the form of a photon. These energy states can be electronic, vibrational, rotational, or any combination thereof. The transition responsible for luminescence can be stimulated through the release of energy stored in the system chemically or added to the system from an external source. The external source of energy can be of a variety of types including chemical, thermal, electrical, magnetic, electromagnetic, and physical, or any other type of energy source capable of causing a system to be excited into a state higher in energy than the ground state. For example, a system can be excited by absorbing a photon of light, by being placed in an electrical field, or through a chemical oxidation-reduction reaction. The energy of the photons emitted during luminescence can be in a range from low-energy microwave radiation to high-energy x-ray radiation. Typically, luminescence refers to photons in the range from UV to IR radiation, and usually refers to visible electromagnetic radiation (i.e., light).

The term "monodisperse" refers to a population of particles (e.g., a colloidal system) wherein the particles have substantially identical size and shape. For the purpose of the present invention, a "monodisperse" population of particles means that at least about 60% of the particles, preferably about 75–90% of the particles, fall within a specified particle size range. A population of monodisperse particles deviates less than 10% rms (root-mean-square) in diameter and preferably less than 5% rms.

The phrase "one or more sizes of nanoparticles" is used synonymously with the phrase "one or more particle size distributions of nanoparticles." One of ordinary skill in the art will realize that particular sizes of nanoparticles such as semiconductor nanocrystals are actually obtained as particle size distributions.

By use of the term "narrow wavelength band" or "narrow spectral linewidth" with regard to the electromagnetic radiation emission of the semiconductor nanocrystal is meant a wavelength band of emissions not exceeding about 60 nm, and preferably not exceeding about 30 nm in width, more preferably not exceeding about 20 nm in width, and symmetric about the center. It should be noted that the bandwidths referred to are determined from measurement of the full width of the emissions at half peak height (FWHM), and are appropriate in the emission range of 200–2000 nm.

By use of the term "a broad wavelength band," with regard to the excitation of the semiconductor nanocrystal is meant absorption of radiation having a wavelength equal to, or shorter than, the wavelength of the onset radiation (the onset radiation is understood to be the longest wavelength (lowest energy) radiation capable of being absorbed by the semiconductor nanocrystal). This onset occurs near to, but at slightly higher energy than the "narrow wavelength band" of the emission. This is in contrast to the "narrow absorption band" of dye molecules, which occurs near the emission peak on the high energy side, but drops off rapidly away from that wavelength and is often negligible at wavelengths further than 100 nm from the emission.

The term "emission peak" refers to the wavelength of light within the characteristic emission spectra exhibited by a particular semiconductor nanocrystal size distribution that demonstrates the highest relative intensity.

The term "alkyl" as used herein refers to a branched or unbranched saturated hydrocarbon group of 1 to approximately 24 carbon atoms, such as methyl, ethyl, n-propyl, isopropyl, n-butyl, isobutyl, t-butyl, octyl, decyl, tetradecyl, hexadecyl, eicosyl and tetracosyl, as well as cycloalkyl groups such as cyclopentyl and cyclohexyl. Similarly, alkanes are saturated hydrocarbon compounds such as methane, ethane, and so forth. The term "lower alkyl" is intended to mean an alkyl group of 1 to 4 carbon atoms, and thus includes methyl, ethyl, n-propyl, isopropyl, n-butyl, isobutyl and t-butyl.

The term "alkene" as used herein refers to a branched or unbranched hydrocarbon compound typically although not necessarily containing 2 to about 24 carbon atoms and at least one double bond, such as ethylene, n-propylene, iso-propylene, butene, butylene, propylene, octene, decylene, and the like. Generally, although not necessarily, the alkenes used herein contain 2 to about 29 carbon atoms, preferably about 8 to about 20 carbon atoms. The term "lower alkene" is intended to mean an alkene of 2 to 4 carbon atoms.

The term "alkyne" as used herein refers to a branched or unbranched hydrocarbon group typically although not necessarily containing 2 to about 24 carbon atoms and at least one triple bond, such as acetylene, allylene, ethyl acetylene, octynyl, decynyl, and the like. Generally, although again not necessarily, the alkynes used herein contain 2 to about 12 carbon atoms. The term "lower alkyne" intends an alkyne of 2 to 4 carbon atoms, preferably 3 or 4 carbon atoms.

II. Precursors

There are numerous inorganic materials that are suitable for use as materials for the core and/or shell of semiconductor nanoparticles. These include, by way of illustration and not limitation, materials comprised of a first element selected from Groups 2 and 12 of the Periodic Table of the Elements and a second element selected from Group 16 (e.g., ZnS, ZnSe, ZnTe, CdS, CdSe, CdTe, HgS, HgSe, HgTe, MgS, MgSe, MgTe, CaS, CaSe, CaTe, SrS, SrSe, SrTe, BaS, BaSe, BaTe, and the like); materials comprised of a first element selected from Group 13 of the Periodic Table of the Elements and a second element selected from Group 15 (GaN, GaP, GaAs, GaSb, InN, InP, InAs, InSb, and the like); ternary and quaternary mixtures comprised of a Group 14 element (Ge, Si, and the like); materials comprised of a first element selected from Group 14 element of the Periodic Table of the Elements and a second element selected from Group 16 (e.g., PbS, PbSe and the like); materials comprised of a first element selected from Group 13 of the Periodic Table of the Elements and a second element selected from Groups 15 and 16 (e.g., AlS, AlP, AlSb, and the like); and alloys and mixtures thereof. As used herein, all reference to the Periodic Table of the Elements and groups thereof is to the new IUPAC system for numbering element groups, as set forth in the Handbook of Chemistry and Physics, 81$^{st}$ Edition (CRC Press, 2000).

The selection of the composition of the semiconductor nanoparticle affects the characteristic spectral emission wavelength of the semiconductor nanocrystal. Thus, as one of ordinary skill in the art will realize, a particular composition of a nanoparticle of the invention will be selected based upon the spectral region being monitored. For example, semiconductor nanocrystals that emit energy in the visible range include, but are not limited to, CdS, CdSe, CdTe, ZnSe, ZnTe, GaP, and GaAs. Semiconductor nanocrystals that emit energy in the near IR range include, but are not limited to, InP, InAs, InSb, PbS, and PbSe. Finally, semiconductor nanocrystals that emit energy in the blue to near-ultraviolet include, but are not limited to, ZnS and GaN.

Precursors useful as the "first" precursor in the methods of the invention include compounds containing elements from Groups 2 and 12 of the Periodic Table of the Elements (e.g., Zn, Cd, Hg, Mg, Ca, Sr, Ba, and the like), compounds containing elements from Group 13 of the Periodic Table of the Elements (Al, Ga, In, and the like), and compounds containing elements from Group 14 of the Periodic Table of the Elements (Si, Ge, Pb, and the like).

Precursors useful as the "second" precursor in the methods of the invention include compounds containing elements from Group 16 of the Periodic Table of the Elements (e.g., S, Se, Te, and the like), compounds containing elements from Group 15 of the Periodic Table of the Elements (N, P, As, Sb, and the like), and compounds containing elements from Group 14 of the Periodic Table of the Elements (Ge, Si, and the like).

Many forms of the precursors can be used in the methods of the invention. Suitable element-containing compounds useful as the first precursor, can be organometallic compounds such as $Cd(CH_3)_2$, oxides such as CdO, halogenated compounds such as $CdCl_2$, and other salts such as cadmium acetate.

Suitable second precursors include tri-n-alkylphosphine adducts such as tri-n-(butylphosphine)selenide (TBPSe) and tri-n-(octylphosphine)selenide (TOPSe), hydrogenated compounds such as $H_2Se$, silyl compounds such as bis(trimethylsilyl)selenium (($TMS)_2Se$), and metal salts such as NaHSe. These are typically formed by combining a desired element, such as Se, with an appropriate coordinating solvent, e.g., TOP. Other exemplary organic precursors are described in U.S. Pat. Nos. 6,207,299 and 6,322,901 to Bawendi et al., and synthesis methods using weak acids as precursor materials are disclosed by Qu et al., (2001) "Alternative Routes toward High Quality CdSe Nanocrystals," Nano Lett., 1(6):333–337, the disclosures of which are incorporated herein by reference.

Both the first and the secondary precursor can be combined with an appropriate coordinating solvent to form a solution for use in the methods of the invention. The coordinating solvent used to form a first precursor solution may be the same or different from that used to form a second precursor solution.

III. Coordinating Solvent

Suitable coordinating reaction solvents include, by way of illustration and not limitation, amines, alkyl phosphines, alkyl phosphine oxides, fatty acids, ethers, furans, phosphoacids, pyridines, alkenes, alkynes and combinations thereof. The solvent may actually comprise a mixture of solvents, often referred to in the art as a "solvent system". Further-more, the coordinating solvent might be a mixture of an essentially non-coordinating solvent such as an alkane and a ligand as defined below.

Suitable amines include, but are not limited to, alkylamines such a dodecylamine and hexyldecylamine, and so forth.

Exemplary alkyl phosphines include, but are not limited to, the trialkyl phosphines, tri-n-butylphosphine (TBP), tri-n-octylphosphine (TOP), and so forth.

Suitable alkyl phosphine oxides include, but are not limited to, the trialkyl phosphine oxide, tri-n-octylphosphine oxide (TOPO), and so forth.

Exemplary fatty acids include, but are not limited to, stearic and lauric acids. It will be appreciated that the rate of nanocrystal growth generally increases as the length of the fatty acid chain decreases.

Exemplary ethers and furans include, but are not limited to, tetrahydrofuran and its methylated forms, glymes, and so forth.

Suitable phospho-acids include, but are not limited to hexylphosphonic acid, tetradecylphosphonic acid, and octylphosphinic acid, and are preferably used in combination with an alkyl phosphine oxide such as TOPO.

Exemplary pyridines include, but are not limited to, pyridine, alkylated pyridines, nicotinic acid, and so forth.

Coordinating solvents can be used alone or in combination. TOP-TOPO solvent systems are commonly utilized in the art, as are other related (e.g., butyl) systems. For example, TOP and TOPO can be used in combination to form a cadmium solution, while TOP, alone, can be used to form a selenium solution.

Technical grade coordinating solvents can be used, and benefits can be obtained from the existence of beneficial impurities in such solvents, e.g. TOP, TOPO or both. However, in one preferred embodiment, the coordinating solvent is pure. Typically this means that the coordinating solvent contains less than 10 vol %, and more preferably less than 5 vol % of impurities that can function as reductants. Therefore, solvents such as TOPO at 90% or 97% purity and TOP at 90% purity are particularly well suited for use in the methods of the invention.

IV. Ligand

In one preferred embodiment, ligands are included in the reaction. Ligands are compounds that complex with a precursor and/or a nanoparticle. Suitable ligands include, by way of illustration and not limitation, phospho-acids such as hexylphosphonic acid and tetradecylphosphonic acid, carboxylic acids such as isomers of octadecanoic acid, amines, amides, alcohols, ethers, alkenes, and alkynes. In some cases, the ligand and the solvent can be the same.

V. Reaction Promoter

The methods of the invention, to some extent, are based upon the premise that particle growth kinetics are strongly impacted by the effectiveness of the initial nucleation events and that the chemical reduction of one of the precursors is expected to be an important rate-determining factor. This is in contrast with state of the art methodologies that operate under the assumption that precursor/particle sequestration events and the precursor-injection temperature drop dominates the nucleation/growth temporal interface.

The reaction promoter increases the reactivity of the nanoparticle precursors in such a way so as to allow control of the nucleation process, or growth process, or both. In the methods of the invention, the reactants are exposed to the reaction promoter in a carefully controlled manner, typically by physically adding the reaction promoter to the mixture. This serves to provoke and modulate increased reactivity.

In the fast kinetic growth regime, nanoparticles can grow rapidly when the concentration of monomer precursors is high relative to the number of particles. Such growth is accompanied by narrowing of the particle size distribution. As long as this condition exists, the particle size distribution can remain focused. When the monomer concentration is reduced to a level that cannot maintain the optimum growth rate, statistical broadening of size distributions is generally observed. Optimally, the reaction should be stopped prior to the occurrence of such defocusing so as to ensure optimally narrow particle size distributions. The methods of the invention achieve this by controlling the number of nuclei formed. The initial reactivity is controlled to make fewer nuclei and to obtain larger particles. When smaller particles are desired, reactivity can be boosted to produce more nuclei. In either case, the reaction is stopped at the point where growth begins to slow due to monomer depletion. This corresponds to the maximum practical yield for the chosen particle size, while not sacrificing narrow particle size distribution.

The reaction promoter can be an oxygen source or a reducing agent. While not wishing to be bound by theory, there are several ways in which the oxygen reaction promoter, for example, may be functioning in the methods described herein. First, in the presence of $O_2$, the initial nuclei in the core reaction may not be CdSe, but rather CdO (or CdOH). These nuclei form more easily than the CdSe nuclei for a variety of reasons, such as issues of driving force, activation, and differential sequestration of precursors. These cores can provide a growth site for CdSe. During the process, the oxygen atoms can be annealed out or can remain at the core of the final material. Second, some impurities may be present in the reaction, for example from the TOP. These impurities may hinder the growth of particles through sequestration of redox reactivity. In this case, the oxygen in the reaction may be responsible for destroying the impurities and thus indirectly facilitating the reaction.

It is preferable to use two reducing equivalents per precursor (e.g., cadmium) equivalent to prepare the nanoparticles when salt feedstocks are utilized (or created in situ through, for example acid-base reactions). Oxygen may facilitate these redox reactions directly or indirectly through the formation of some intermediates. An example of this indirect mechanism involves initial oxidation of TOP to a species such as di-octyl-octylphosphinate. This species might disproportionate to form di-octylphosphine and octyl-di-octylphosphonate by the following scheme:

$R_3P + O_2 \longrightarrow$

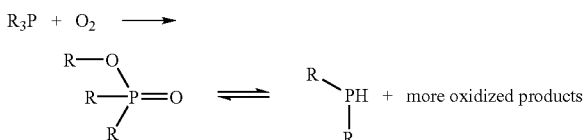

more oxidized products

Similar chemistries are possible with other oxidized impurities such as di-octylphosphine oxide. The resulting secondary (or primary) phosphines are potent reductants that would be expected to enhance the reaction rates as observed. This last mechanism supports the direct addition of such phosphines as reducing agents as described below. Addition of oxidants and/or proton carriers other than oxygen/water can provide an even more serviceable approach to taking full advantage of this effect.

Figure 2:
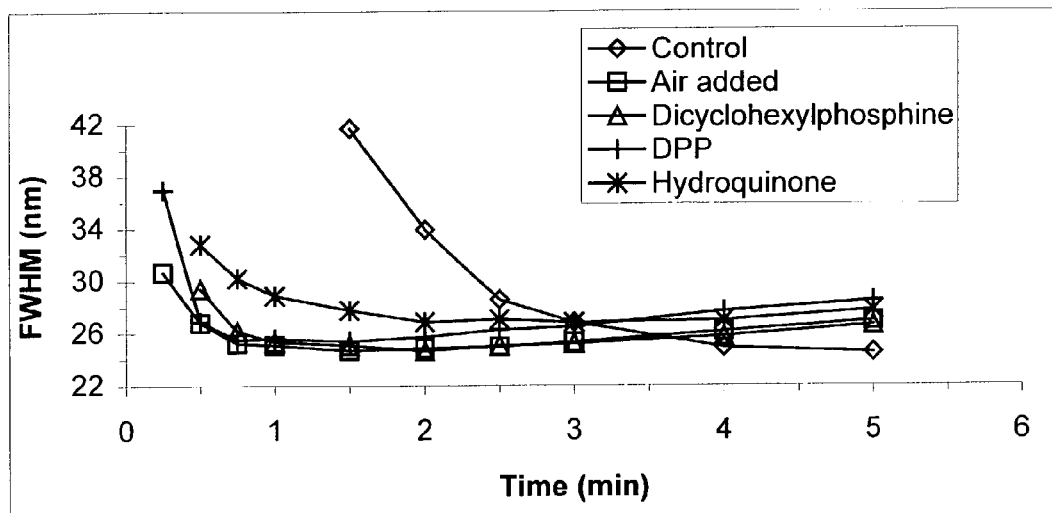

FIG. 1 and FIG. 2 show the effect on temporal wavelength evolution during the course of a CdSe nanocrystals core-forming reaction as a function of added reaction promoter. The line labeled "Control" is the standard reaction with no added reaction promoter. The line labeled "Air added" shows the effects of exposure of the reaction to air on peak emission wavelength and emission FWHM. The remaining three lines depict the reaction course when equivalent amounts of reducing agent reaction promoters are used, specifically, dicyclohexylphosphine, DPP, and hydroquinone. FIG. 1 demonstrates that both an oxygen source as well as reducing agents are suitable for use as reaction promoters in the methods of the invention. The key characteristics of these plots are the length of the pre-nucleation induction, the initial nuclei size, the stall wavelength for growth, and the evolution of the degree of dispersity (as estimated by emission FWHM).

Figure 3:
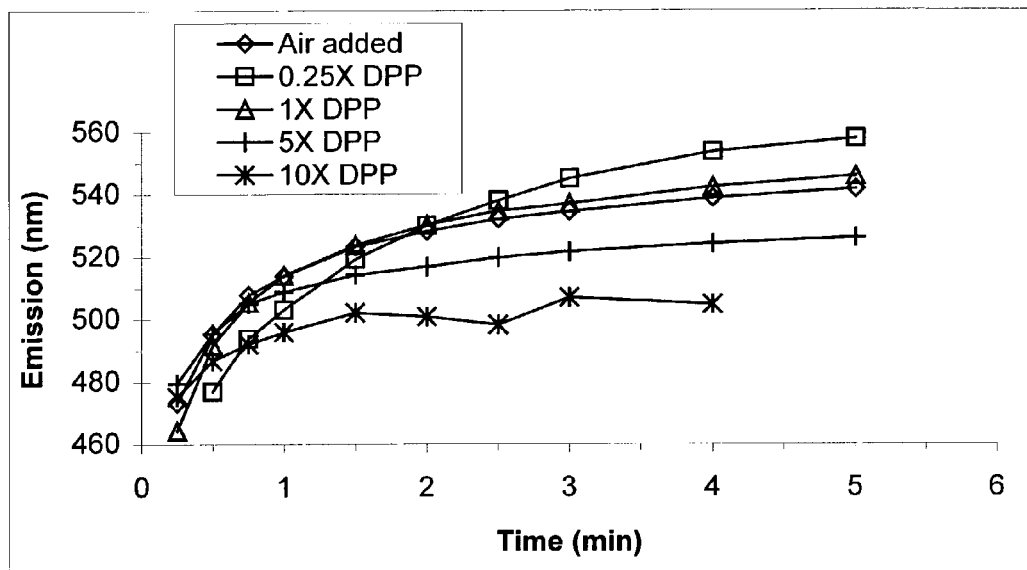
FIG. 3 and FIG. 4 are graphical representations of the effect of increasing amounts of diphenylphosphine (DPP) on emission peak wavelength and FWHM as described in Example 1.
Figure 4:
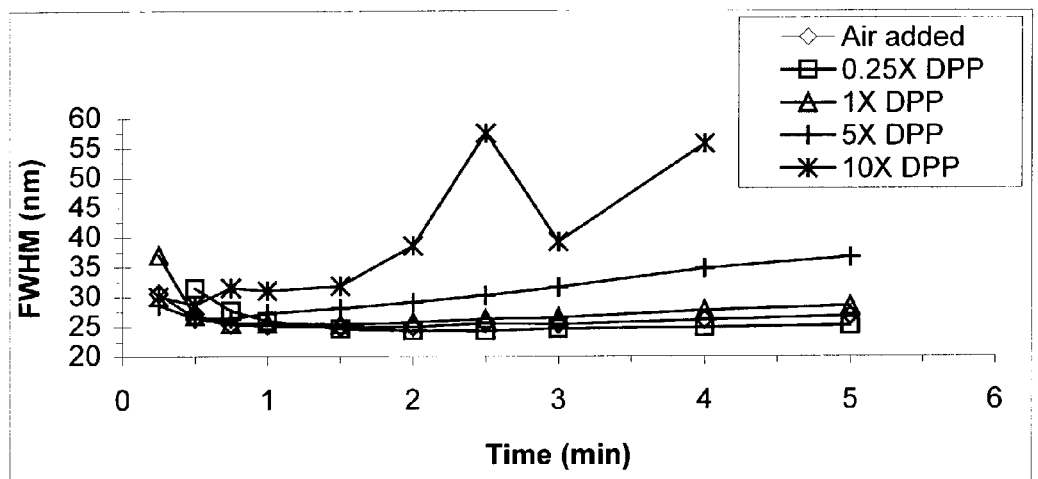

FIG. 3 and FIG. 4 illustrate the use of increasing amounts of the reaction promoter, DPP. The concentrations are given as number of equivalents relative to cadmium added to the core reactions. The amount of reaction promoter that is added can be used to tune the properties of the reactions including the yield of particles.

Figure 5:
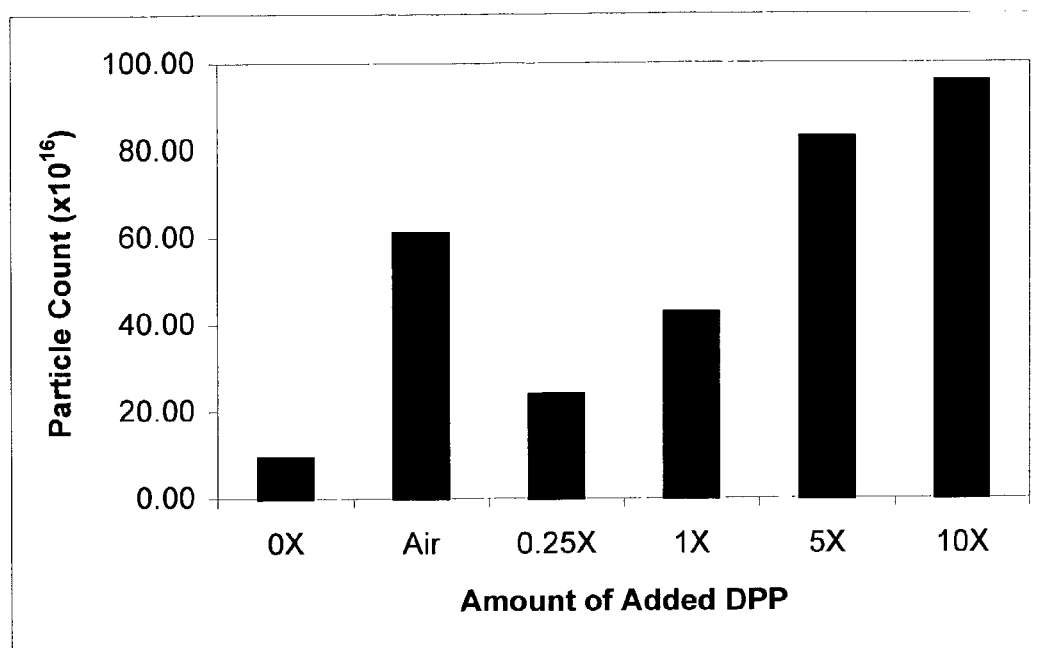
FIG. 5 is a graphical representation of the particle counts recovered from each of the reactions shown in the FIG. 2 and illustrates the level of control afforded by the use of reaction promoters.

FIG. 5 illustrates the particle counts recovered from each of the reactions shown in FIG. 3 and illustrates the level of control afforded by the addition of reaction promoters.

1. Reducing Agents

The reducing agent functions to provide electrons (reducing equivalents) to the reactants or reactant mixture. Phosphine-based reductants are a preferred class of reducing agents for use in the methods of the invention. However, non-phosphine, non-ligating chemical reductants such as hydroquinone are also suitable to provide the necessary reducing equivalents. Accordingly, suitable reducing agents include, by way of illustration and not limitation, chemical compounds such as tertiary, secondary, and primary phosphines (e.g., diphenylphosphine, dicyclohexylphosphine, and dioctylphosphine); amines (e.g., decyl- and hexadecylamine); hydrazines; hydroxyphenyl compounds (e.g., hydroquinone and phenol); hydrogen; hydrides (e.g., sodium borohydride, sodium hydride and lithium aluminum hydride); metals (e.g., mercury and potassium); boranes (e.g., $THF:BH_3$ and $B_2H_6$); aldehydes (e.g., benzaldehyde and butyraldehyde); alcohols and thiols (e.g., ethanol and thioethanol); reducing halides (e.g., $I^-$ and $I_3^-$); polyfunctional reductant versions of these species (e.g., a single chemical species that contains more than one reductant moiety, each reductant moiety having the same or different reducing capacity, such as tris-(hydroxypropyl)phosphine and ethanolamine); and so forth.

In addition, it is expected that there may be particular advantages associated with the use of an electrochemical system (cathode-anode system) as the reducing agent, i.e., the cathode would serve as a source of electrons. By utilizing an electrode as a source of reducing equivalents, coulombic equivalents can be readily counted and their rate of delivery directly controlled. Use of electrodes also allows for controlling both the physical localization of reduction events, as well as the potential for direct formation of particle arrays at the electrode surface. Since the cathode will be positioned within the reaction chamber, the material selection is preferably one that will not react with the precursors, ligand or coordinating solvents. The anode, will typically be positioned outside of the reaction vessel so material selection is not limited and any well known anode material can be used. Exemplary cathode materials include platinum, silver, or carbon. An exemplary method for delivering reducing equivalents to the cathode includes the use of a constant current or potentiostat in a two- (working and counter) or three-electrode (working, counter, and reference) configuration.

2. Oxygen

The reaction promoter can also be any source of oxygen. In one embodiment of the invention, the reaction promoter is an air stream, preferably dry. In this embodiment, the mixture is exposed directly to the oxygen or oxygen source.

The oxygen can also be formed in situ. Accordingly, in another embodiment, the precursors are exposed to compounds which provide the same effect as the aforementioned controlled exposure to air. For example, oxygen can be formed by a redox reaction. Therefore, since the mechanism by which oxygen enhances the process could include a reduction step, reducing agents can added directly to utilize redox reactivity. Suitable reducing agents are those described above.

Previous methods for the high temperature synthesis of nanoparticles use air-free conditions due to the combustive nature of the reaction precursors. However, the methods of the invention provide for exposing the reactants to the oxygen reaction promoter in such a way so as to reduce or eliminate this combustion hazard.

VI. Methods of Producing Nanoparticles

The methods described herein find utility in producing a variety of nanoparticles, including metal-chalcogen nanoparticles such as CdSe, CdTe, CdS, ZnS, ZnSe, and so forth.

One embodiment of the invention is a method of producing nanoparticles comprising: (a) mixing a first precursor and at least one coordinating solvent to form a first mixture; (b) exposing the first mixture to a reaction promoter selected from the group consisting of oxygen and a reducing agent; (c) heating the first mixture to a temperature that is sufficiently high to form nanoparticles (nucleation crystals) when a second precursor is added; (d) introducing a second precursor into the first mixture to form a second mixture thereby resulting in the formation of a plurality of nanoparticles; and (e) cooling the second mixture to stop further growth of the nanoparticles.

In one embodiment, the reaction promoter is a reducing agent and the exposing step can involve adding a chemical reducing agent to the mixture or the mixture can be exposed to an appropriate electrode reducing agent. In another embodiment, the exposure step involves directly exposing the mixture to a source of oxygen. The oxygen can be from an external source or it can be created in situ. In yet another embodiment, the exposing step involves exposing a coordinating solvent to a source of oxygen and then adding this exposed coordinating solvent to the mixture.

The mixing step is typically conducted at an elevated temperature or the reaction mixture is heated to an elevated temperature while mixing. This elevated temperature is commonly within the range of about 150 to 350° C. In addition, the mixing step can be conducted in a vessel that is evacuated and filled and/or flushed with an inert gas such as nitrogen. The filling can be periodic or the filling can occur, followed by continuous flushing for a set period of time. The mixing step can involve a cooling step prior to exposure to the reaction promoter, for example, cooling to a temperature within the range of about 50 to 150° C., typically about 100° C.

The exposing step was described above with regard to the reaction promoter, and can be conducted either at an elevated temperature (e.g., 150 to 350° C.) or at a reduced temperature (e.g., 50 to 1 50° C.). In addition, the reaction promoter can be heated to a temperature such as within the range of about 50 to 150° C., prior to being added to the mixture.

The heating step is done at a temperature that is sufficient to induce temporally discrete homogeneous nucleation, which results in the formation of a monodisperse population of individual nanoparticles. Typically, this heating step achieves a temperature within the range of about 150–350° C., more preferably within the range of about 250–350° C.

It is understood, however, that the above ranges are merely exemplary and are not intended to be limiting in any manner as the actual temperature ranges may vary, dependent upon the relative stability of the reaction promoter, precursors, ligands and coordinating solvents.

The introducing step may be an injection step, which typically involves applying pressure to the second precursor so that a fluid stream can be injected into the heated mixture. Pressure can be applied in numerous ways, for example by means of a pressurized inert gas, a syringe, a pumping means, and so forth, as well as combinations thereof. The resulting mixture may be heated so as to maintain the elevated temperature. Thus, the introducing step is conducted at a temperature within the range of about 150–350° C., more preferably within the range of about 250–270° C. The introducing step can be carried out in one rapid step or slowly over time.

The secondary precursor is typically combined with an appropriate coordinating solvent to form a solution for use in the method of the invention. This coordinating solvent may be the same or different from that used in combination with the first precursor.

The cooling step typically achieves a temperature within the range of about 50–150° C., more preferably within the range of about 90–110° C. However, the actual temperature range may vary, dependent upon the relative stability of the reaction promoter, precursors, ligands and coordinating solvents.

Size distribution during the growth stage of the nanoparticles can be approximated by monitoring the emission of a particle sampling.

Exemplary embodiments are set forth below, as well as in the examples.

In one exemplary embodiment, nanoparticles are produced by a method where the first precursor is exposed to the reaction promoter, oxygen. A cadmium solution is prepared by first dissolving anhydrous cadmium acetate in TOP, and this mixture is then mixed with TOPO, TDPA and additional TOP. Dry air is then injected into the reaction vessel so as to expose the mixture to oxygen. The duration of exposure can be from 1–10 minutes, or longer. Heating is then done for a sufficient time and temperature so as to insure formation of nanoparticles when the second precursor is added, for example, heating to 270° C. A selenium solution, previously prepared by dissolving Se in TOP, is then introduced by injection into the cadmium solution, thus forming CdSe nanoparticles. The reaction is stopped by cooling.

In another exemplary embodiment, nanoparticles are produced by a method where a coordinating solvent is exposed to oxygen and then added to the first precursor. A cadmium solution is prepared by first dissolving anhydrous cadmium acetate in TOP, and this mixture is then mixed with TOPO, TDPA and additional TOP. The mixture is heated to a temperature sufficiently high to insure formation of nanoparticles when the second precursor is added, and the elevated temperature maintained. In a separate container, TOP is heated and exposed to air. The duration of exposure can be for a period of between 10 minutes and 48 hours, preferably between 30 minutes and 24 hours, and even more preferably 50 minutes to 2 hours. The air-exposed TOP is then added to the cadmium solution. A selenium solution, previously prepared by dissolving Se in TOP, is then introduced by injection into the cadmium solution, thus forming CdSe nanoparticles. The reaction is stopped by cooling.

Another exemplary embodiment, pertains to the production of nanoparticles by a method where the first precursor is exposed to a chemical reducing agent reaction promoter. A cadmium solution is prepared by first dissolving anhydrous cadmium acetate in TOP, and this mixture is then mixed with TOPO and TDPA. A chemical reducing agent such as dicyclohexylphosphine, diphenylphosphine or hydroquinone is then added to the mixture, and the mixture heated to a temperature sufficiently high to insure formation of nanoparticles when the second precursor is added. A selenium solution, previously prepared by dissolving Se in TOP, is then introduced by injection into the cadmium solution, thus forming CdSe nanoparticles. The reaction is stopped by cooling.

Another exemplary embodiment, pertains to the production of nanoparticles by a method wherein the addition of a reaction promoter is used to induce nucleation. A precursor solution is prepared by first dissolving anhydrous cadmium acetate in TOP, and this mixture is then mixed with TOPO and TDPA and a TOP solution of Se. The mixture is heated to a temperature sufficiently high to insure formation of nanoparticles when the promoter is added. Nucleation and subsequent growth of nanoparticles is then induced by introduction of a suitable reaction promoter. For example, a chemical reducing agent reaction promoter such as dicyclohexylphosphine, diphenylphosphine or hydroquinone is then introduced by injection into the mixture, thus forming CdSe nanoparticles. The reaction is stopped by cooling.

Figure 8:
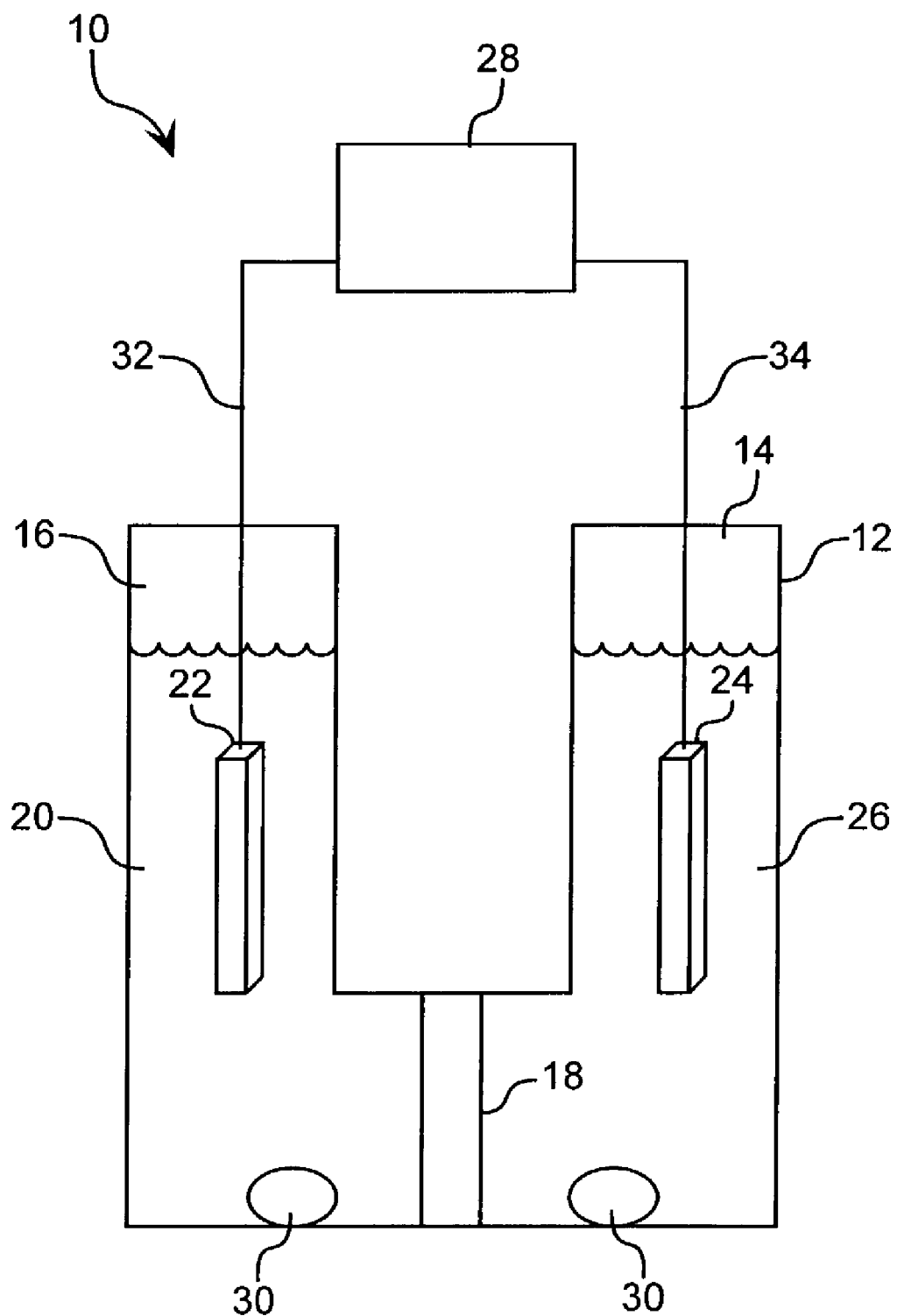
FIG. 8 is an illustration of one implementation of an electrochemical system which could be used to prepare nanocrystals by the methods described here.

Another exemplary embodiment, illustrated in FIG. 8, pertains to the production of nanoparticles by a method where the first precursor is exposed to an electrode reducing agent reaction promoter. The system 10 includes a reaction vessel 12 having first 14 and second 16 compartments separated by an ion permeable barrier 18. A cadmium solution is prepared by first dissolving anhydrous cadmium acetate in TOP, and this mixture is then mixed with TOPO and TDPA. The resulting mixture 20 is placed in compartment 16. An electrochemical system reaction promoter, such as a platinum cathode 22 is then immersed in mixture 20. A platinum anode 24 would be set up immersed in a solution containing an oxidizable component (e.g., iodide) 26 in compartment 14 and an appropriate power supply 28 would be set up outside the reaction vessel, and in electrical communication with cathode 22 and anode 24 through leads 32 and 34, respectively. Optionally, magnetic stirring bars 30 can be placed in compartments 14 and 16. The mixture is heated to a temperature sufficiently high to insure formation of nanoparticles when the second precursor is added at an appropriate potential. A selenium solution, previously prepared by dissolving Se in TOP, is then injected into the cadmium solution 20 in compartment 16. A negative potential is applied at the cathode 22 to induce formation of nanoparticles. The reaction is stopped by cooling, and/or by removing the potential.

VII. Methods of Forming Nanoparticle Shells

The surface of the semiconductor nanoparticle can be modified to enhance the efficiency of the emissions, by adding an inorganic layer or shell. The overcoating layer can be particularly useful since surface defects on the semiconductor nanoparticle can result in traps for electrons or holes that degrade the electrical and optical properties of the nanoparticle. An insulating layer at the surface of the nanoparticle provides an atomically abrupt jump in the chemical potential at the interface that eliminates energy states that can serve as traps for the electrons and holes. This results in higher efficiency in the luminescent process.

The nanoparticles produced by the methods described herein can be provided with a shell by any method known in the art. See for example, Dabbousi et al., *J. Phys. Chem. B* 101:9463 (1997), Hines et al., *J. Phys. Chem.* 100:468–471 (1996), Peng et al., *J. Am. Chem. Soc.* 119:7019–7029 (1997), and Kuno et al., *J. Phys. Chem.* 106:9869 (1997). In addition, the nanoparticles of the invention can also be provided with a shell using the reaction promoter-based method described herein. In fact, the reaction promoter-based methods of the invention find utility in nanoparticle shell procedures for both nanoparticle cores produced by the methods described herein as well as nanoparticle cores produced by other methods.

The shell can have a thickness within the range of about 1–100 nm, and is preferably within the range of about 2–10 nm thick.

Suitable materials for the inorganic shell layer include semiconductor materials having a higher bandgap energy than the semiconductor nanoparticle core. In addition to having a bandgap energy greater than the core, suitable materials for the shell should have good conduction and valence band offset with respect to the core. Thus, the conduction band is desirably higher and the valence band is desirably lower than those of the core. For a semiconductor nanoparticle core that emits energy in the visible (e.g., CdS, CdSe, CdTe, ZnSe, ZnTe, GaP, GaAs) or near IR (e.g., InP, InAs, InSb, PbS, PbSe) range, materials that have a bandgap energy in the ultraviolet regions may be used. Exemplary materials include ZnS, GaN, and magnesium chalcogenides, e.g., MgS, MgSe, and MgTe. For a semiconductor nanoparticle core that emits in the near IR range, materials having a bandgap energy in the visible range, such as CdS or CdSe, may also be used.

In addition, a passivation layer of the desired thickness can also be easily introduced onto semiconductor nanoparticles of the invention by introducing appropriate solvents and/or surfactants during the nanoparticle manufacture. For example, semiconductive nanoparticles, as manufactured by the methods described herein, can be provided with a water-insoluble organic overcoat that has an affinity for the semiconductive core material. This coating will typically be a passivating layer produced by one or more coordinating solvents as described above, e.g., hexyldecylamine, TOPO, TOP, TBP, and so forth; or produced by one or more hydrophobic surfactants such as, by way of example, octanethiol, dodecanethiol, dodecylamine, tetraoctylammonium bromide, and so forth, as well as combinations thereof.

Further, as noted above, the nanoparticle shell can be produced by the reaction promoter-based methods of the invention. Accordingly, an embodiment of the invention is a method of producing a nanoparticle shell comprising: producing nanoparticles using steps (a) though (e) described above in Section VI; (a') mixing the nanoparticles with at least one coordinating solvent to form a third mixture; (b') heating the third mixture to a temperature that is sufficiently high to form a shell on the nanoparticles when third and fourth precursors are added; (c') introducing third and fourth precursors into the third mixture to form a fourth mixture thereby resulting in the formation of shells on a plurality of nanoparticles; and (d') cooling the third mixture to stop further growth of the shell; wherein the method further comprises exposing the third or fourth mixture to a reaction promoter selected from the group consisting of oxygen and a reducing agent. Exposure to the reaction promoter can occur at several stages during the shell production method. For example, the third mixture can be exposed to the reaction promoter after step (a'), the heated third mixture can be exposed to the reaction promoter after step (b'), or the fourth mixture can be exposed to the reaction promoter in step (c'). In a preferred embodiment, the third mixture is exposed to the reaction promoter after step (a').

As noted above, the semiconductor materials used in the shell preferably have a higher bandgap energy than the semiconductor nanoparticle core. Therefore, the precursors used in steps (d) ("first" and "second" precursors) are preferably different than the precursors used in step (c') ("third" and "fourth" precursors). However, the ligand (if used) and coordinating solvents used in step (a') can be the same or different from those used in step (a).

In addition, the shell producing method of the invention also finds utility for nanoparticle cores produced by any method known in the art. Accordingly, another embodiment of the invention is a method of producing nanoparticle shells comprising (a) mixing nanoparticles with at least one coordinating solvent to form a first mixture; (b) heating the first mixture to a temperature that is sufficiently high to form a shell on the nanoparticles when first and second precursors are added; (c) introducing first and second precursors into the first mixture to form a second mixture thereby resulting in the formation of shells on a plurality of nanoparticles; and (d) cooling the second mixture to stop further growth of the shell; wherein the method further comprises exposing the first or second mixture to a reaction promoter selected from the group consisting of oxygen and a reducing agent. As noted above, exposure to the reaction promoter can occur at several stages during the shell production method. For example, the first mixture can be exposed to the reaction promoter after step (a), the heated first mixture can be exposed to the reaction promoter after step (b), or the second mixture can be exposed to the reaction promoter in step (c). In a preferred embodiment, the first mixture is exposed to the reaction promoter after step (a).

VIII. Shell Additives

The methods of the invention also find utility in nanoparticles as described in commonly owned, co-pending U.S. patent application Ser. No. 10/198,635, filed on Jul. 17, 2002, by Treadway et al., the disclosure of which in incorporated herein in its entirety, for both nanoparticles produced by the methods described herein or produced by state of the art methods.

Accordingly, an embodiment of the invention is a method of producing nanoparticles comprising: producing nanoparticles using steps (a) though (e) described above or produced by any state of the art method; and (a') mixing the nanoparticles with an additive or additive precursor, an optional ligand and at least one coordinating solvent to form a third mixture; (b') exposing the third mixture to a reaction promoter selected from the group consisting of oxygen and a reducing agent; (c') heating the third mixture to a temperature that is sufficiently high to form a shell on the nanoparticles when third and fourth precursors are added; (d')

introducing third and fourth precursors into the third mixture to form a fourth mixture thereby resulting in the formation of shells on a plurality of nanoparticles; and (e') cooling the fourth mixture to stop further growth of the shell. The additive or additive precursor can be any inorganic material that is suitable for use in the manufacture of semiconductor nanoparticles, such as those described herein.

The shell-forming aspect of the inventions as described herein is illustrated as follows. InAs nanoparticles are produced by the methods described herein or by methods that are well known in the art. The nanoparticles are then mixed with an additive precursor (e.g., a source of $In^{+3}$), an optional ligand and at least one coordinating solvent to form a mixture. The mixture is then exposed to a reaction promoter such as DPP. The mixture is heated to the appropriate temperature and first and second precursors (e.g., a source of $Cd^{2+}$ and $Se^0$) are introduced by injection into the mixture to form a CdSe shell. The mixture is then cooled to stop further growth of the shell. Since the $Cd^{+2}$ must be reduced to $Cd^0$ and the $In^{+3}$ must be reduced to $In^0$, at least 5 equivalents of the reaction promoter would be optimal, depending, at least in part, on the relative amounts of additive ($In^{+3}$) and first precursor ($Cd^{2+}$).

IX. Methods of Overcoating Nanoparticles

The nanoparticles of the invention may also be provided with an organic coating. Suitable organic materials include agaroses; cellulose; epoxies; and polymers such as polyacrylamide, polyacrylate, poly-diacetylene, polyether, polyethylene, polyimidazole, polyimide, polypeptides, polyphosphate, polyphenylene-vinylene, polypyrrole, polysaccharide, polystyrene, polysulfone, polythiophene, and polyvinyl. The coating can also be a material such as silica glass; silica gel; siloxane; and the like.

Therefore, the invention also encompasses a method of producing coated nanoparticles comprising: producing nanoparticles, wherein the nanoparticle core and/or shell is produced by the methods of the invention; and mixing the nanoparticles with an organic compound having affinity for the nanoparticle surface, whereby the organic compound displaces the coordinating solvent to form a coating on the nanoparticle surface. The organic coating step is preferably conducted at a temperature within the range of about 50 to 350° C., preferably within the range of about 150 to 250° C. The actual temperature range of the coating step may vary, dependent upon the relative stability of the reaction promoter, precursors, ligands, coordinating solvents and overlayer composition.

EXAMPLES

The practice of the present invention will employ, unless otherwise indicated, conventional techniques of synthetic inorganic, organic chemistry, chemical engineering, and the like, which are within the skill of the art. Such techniques are explained fully in the literature. See, for example, Kirk-Othmer's *Encyclopedia of Chemical Technology*; House's *Modern Synthetic Reactions*; and the *Chemical Engineer's Handbook*.

The following examples are put forth so as to provide those of ordinary skill in the art with a complete disclosure and description of how to make and use the compositions and methods of the invention. Efforts have been made to ensure accuracy with respect to numbers (e.g., amounts, temperature, etc.) but some experimental error and deviations should, of course, be allowed for. Unless indicated otherwise, parts are parts by weight, temperature is degrees centigrade and pressure is at or near atmospheric. All components were obtained commercially unless otherwise indicated.

Materials

In all the examples which follow, materials were obtained as follows, unless otherwise indicated: tri-n-octylphosphine oxide (TOPO, >97% purity) was from Fluka; tri-n-octylphosphine (TOP, 90% purity) was from Alfa Aesar; selenium (99.99% purity) and dicyclohexylphosphine (98% purity) were from Strem; diphenylphosphine (DPP, >90% purity, 99.9% by certificate of analysis) and hydroquinone (+99% purity) were obtained from Aldrich; and anhydrous cadmium acetate (99% purity) was from Prochem. Tetradecylphosphonic acid (TDPA, 98% purity) was either obtained from Alfa or synthesized using methods well known in the art (Kosolapoff, et al., *J. Am. Chem. Soc.* 67:1180–1182 (1945). All reagents were used as received without further purification.

Example 1

Reactions with Phosphines Added

TOPO (6.0 g) and TDPA (0.577 g) were combined in a three-neck round bottom flask equipped with a stir bar, a thermocouple attached to a temperature controller unit, and a condenser connected to a nitrogen/vacuum manifold. The third neck was sealed with a septum. The atmosphere inside the reactor was evacuated once and refilled with dry nitrogen. Inside an inert atmosphere glove box, a cadmium precursor solution (0.5 m) was prepared by combining cadmium acetate (21.6 g) and TOP (166 g) and allowing the mixture to stir for~24 hours until fully dissolved. An aliquot (2.03 g) of this solution was diluted with TOP (3.6 mL) and injected via syringe into the reaction vessel. A 16-gauge needle was inserted into the septum of the reaction vessel so that the vessel could be continuously flushed with nitrogen for approximately 10 min as the reaction was heated to 250° C. The needle was removed and heating continued to 260° C. Heating was continued at 260–270° C. for 10 min. The reaction was cooled to 100° C. and vacuum degassed for 30 min before the vessel was returned to a nitrogen atmosphere. An amount of phosphine (table below) was added as one portion via syringe. The selenium stock solution was prepared by combining selenium (3.2 g) and TOP (66.0 g) inside the inert atmosphere glove box. The temperature controller attached to the reaction vessel was set to 290° C. and at the 270° C. mark, selenium stock (1.4 mL) was rapidly injected to induce nanoparticle formation. Small aliquots were removed periodically from the stirring reaction and diluted in hexane so that emission spectra could be obtained as a function of reaction time.

TABLE 1

| Additive | Proportion | Amount |
|---|---|---|
| Dicyclohexylphosphine | 1 × | 415 µL |
| Diphenylphosphine | 0.25 × | 90 µL |
| Diphenylphosphine | 1 × | 360 µL |
| Diphenylphosphine | 5 × | 1.8 mL |
| Diphenylphosphine | 10 × | 3.6 mL |

Example 2

Reactions with Hydroquinone Added

These reactions were carried out as described in Example 1, with the following modifications. No phosphine-based reaction promoter was added to these reactions. Instead hydroquinone (0.226 g) was combined with the TOPO and TDPA solids prior to the nitrogen flush of the reactor in the first step.

Example 3

Reactions Demonstrating the Use of Air as a Reagent

In this example, TOP was obtained from Fluka and used as received. A solution of Se was prepared by dissolving Se (3.16 g) in TOP (33.2 g) (TOPSe). Separately, a cadmium precursor stock solution was prepared by dissolving anhydrous cadmium acetate (6.15 g) in TOP to a final volume of 40 mL (cadmium stock solution). In each of three round bottom flasks, TOPO (5.0 g) was combined with cadmium stock solution (1.4 mL), TDPA (0.52 g), and TOP (1.1 mL) and heated to 250° C. while continuously flushing the vessel with $N_2$. Once the temperature reached 250° C., the nitrogen flush was halted and the temperature was increased to 270° C. This temperature was maintained for 20 min and the solutions were cooled to 100° C. Using a large-bore needle, dry air was directed into each of two flasks at a rate of 200 ml/min for a duration of 1 minute or 10 minutes. A third flask received dry nitrogen for 10 minutes at the same flow rate. Stirring of the solution was maintained throughout. After the exposure period, the flasks were evacuated and refilled with dry nitrogen. This was repeated once. The flasks were then reheated to 270° C. and an aliquot of the previously prepared TOPSe solution (1.4 mL) was rapidly injected. The reaction temperature was maintained at 270° C. while small samples were periodically removed. Reactions were stopped by cooling to 100° C.

Figure 6:
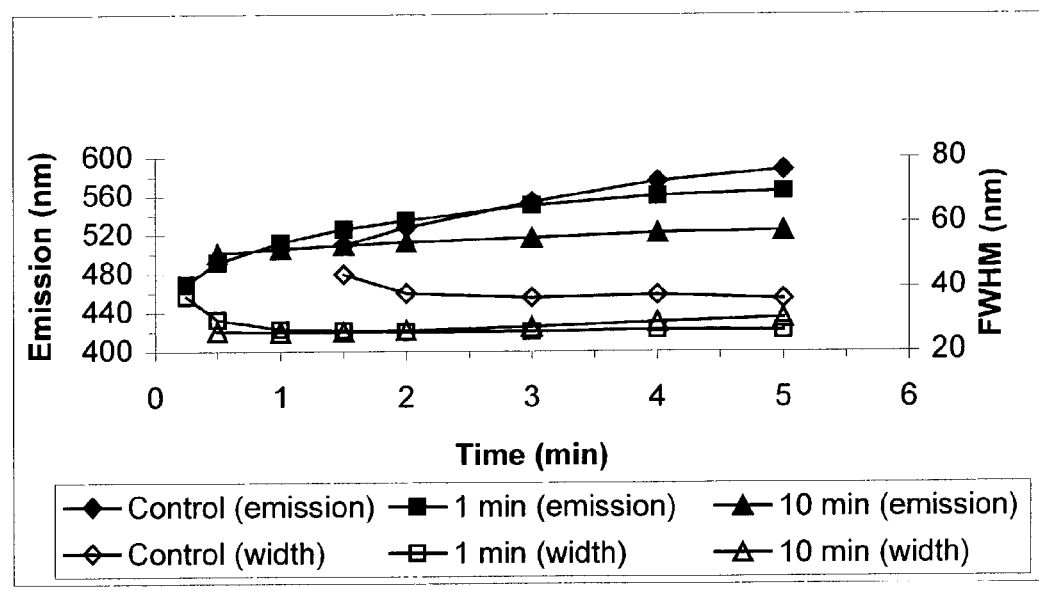
FIG. 6 is a graphical representation of the effect of the time of air exposure prior to the TOPSe injection as described in Example 3. The scale on the left-hand coordinate is the emission peak wavelength in nanometers and the right-hand ordinate is the FWHM peak height in nanometers.

The time period between injection of TOPSe and the first appearance of color was noted. This "induction time" is related to the reactivity of the solution. Yields of the reactions were determined by the peak band-edge absorbance, normalized for particle size. Results are presented in Table 2 and FIG. 6.

TABLE 2

| Condition, time of exposure to air | Induction time, seconds | Relative particle yield | Peak absorbance wavelength, nm |
|---|---|---|---|
| 10 minutes dry nitrogen | 45 | 1 | 582 |
| 1 minute dry air | 6 | 2.8 | 561 |
| 10 minutes dry air | 2 | 18.7 | 510 |

This data indicates that exposure to air resulted in a higher yield than the control conditions, and that the yield is modulated by the length of the air exposure period. Further, it can be seen that the time course evolution of particle size and particle size distribution, is also controllable by the method of the invention. This shows that the reaction can be tuned to achieve a target size while still maintaining a high yield and good particle size uniformity.

Example 4

Cadmium acetate/TOP stock and TOPSe were prepared as in Example 3. In a round bottom flask, 2.5 g TOPO was combined with 0.703 mL cadmium acetate/TOP stock, 0.26 g tetradecylphosphonic acid and 0.55 mL TOP and heated to 250° C. while sparging with $N_2$. Once the temperature reached 250° C., sparging was stopped, the temperature was increased to 270° C. and held at this temperature for 20 minutes. The solution was cooled to 100° C. One neck of the flask was opened and dry compressed air was directed into the stirring solution for 10 minutes. After the exposure period, the flask was evacuated and refilled with dry nitrogen. This was repeated two more times. The flask was then reheated to 240° C. and 0.7 mL of TOPSe was rapidly injected. After 15 seconds, the reaction was stopped by injecting 5 mL TOP and removing the heat source. An aliquot was removed and measurement showed the band-edge absorbance peak at 448 nm with the luminescence peak at 471 nm with 31 nm FWHM.

This data illustrates the ability to independently control the fundamental aspects of the crystal growth process, thereby enabling the high yield synthesis of very small CdSe nanoparticles.

Example 5

Reactions Marking Use of Pre-Air Treatment Reagents

In this example, TOP was obtained from Fluka and used as received. The cadmium precursor and TOPSe were prepared as in Example 3. In each of two round bottom flasks, TOPO (3.0 g) was combined with cadmium stock (0.76 mL), TDPA (0.282 g), and TOP (1.24 mL) and heated to 250° C. while continuously flushing with dry nitrogen. Once the temperature reached 250° C., nitrogen-flushing was halted, and the temperature was increased to 270° C. and held at this temperature. In a separate nitrogen-blanketed flask, TOP (~5 mL) was heated to 100° C. Once the temperature reached 100° C., the flask was opened to air and held at 100° C., while stirring, for 50 minutes. The flask was then closed and evacuated, followed by refilling with nitrogen. This purge/refill was repeated one more time. To one flask containing the cadmium solution (at 270° C.) was added air-exposed TOP (1 mL). To the other cadmium-containing flask (at 270° C.) was added unexposed TOP (1 mL). Using a syringe, an aliquot of TOPSe stock (0.71 mL) was rapidly injected into each flask. The temperature was maintained at 270° C. while small samples were periodically removed. Reactions were stopped by cooling to 100° C.

Figure 7:
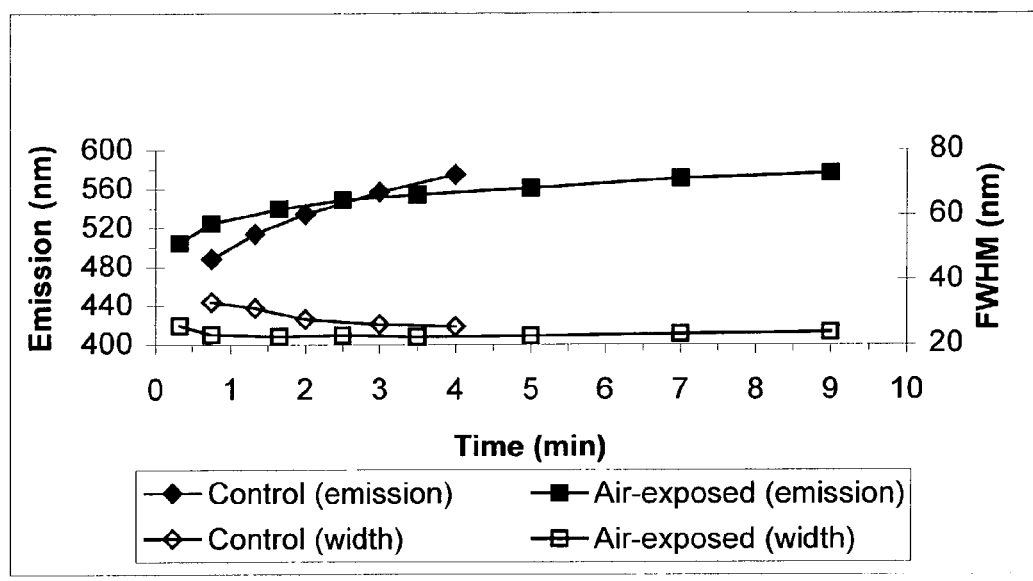
FIG. 7 is a graphical representation of the effect of a spike of air-exposed TOP before the TOPSe injection as described in Example 5.

The time period between injection of TOPSe and the first appearance of color was noted. Yield of the reactions was determined by the peak band-edge absorbance, normalized for particle size. Results are presented in Table 3 and FIG. 7.

This data indicates that exposure of TOP to air generates a material that can be added to a reaction mix, resulting in higher yield and with useful modulation of particle size and particle size distribution.

TABLE 3

| Exposure time of TOP to air | Induction time, seconds | Relative particle yield | Peak absorbance wavelength, nm |
|---|---|---|---|
| None | 18 | 1 | 583 |
| 50 minutes | 4 | 2.875 | 579 |

All patents, publications, and other published documents mentioned or referred to herein are incorporated by reference in their entireties.

It is to be understood that while the invention has been described in conjunction with the preferred specific embodiments thereof, that the foregoing description as well as the examples that follow, are intended to illustrate and not limit the scope of the invention. It should be understood by those skilled in the art that various changes may be made and equivalents may be substituted without departing from the scope of the invention, and further that other aspects, advantages and modifications will be apparent to those skilled in the art to which the invention pertains.

We claim:

1. A method of producing nanoparticles comprising.
   (a) mixing a first precursor and at least one coordinating solvent to form a first mixture;
   (b) exposing the first mixture to a reaction promoter, different from the coordinating solvent, selected from the group consisting of oxygen and a reducing agent, to thereby reduce the first precursor's valency;
   (c) heading the first mixture to a temperature that is sufficiently high to of form nanoparticles when a second precursor is added;
   (d) introducing a second precursor into the first mixture after the first precursor's valency has been reduced to form a second mixture thereby resulting in the formation of a plurality of nanoparticles; and
   (e) cooling the second mixture to stop further growth of the nanoparticles.

2. The method of claim 1 wherein the reaction promoter is a reducing agent.

3. The method of claim 2 wherein the exposing step comprises adding the reducing agent to the first mixture.

4. The method of claim 2 wherein the reducing agent is a chemical reducing agent selected from the group consisting of tertiary, secondary, and primary phosphines; amines; hydrazines; hydroxyphenyl compounds; hydrogen; hydrides; metals; boranes; aldehydes; alcohols; thiols; reducing halides; and polyfunctional reductants.

5. The method of claim 2 wherein the reducing agent is a cathode.

6. The method of claim 5 wherein the cathode is made of a material selected from the group consisting of platinum, silver, and carbon.

7. The method of claim 1 wherein the reaction promoter is oxygen.

8. The method of claim 7 wherein the exposing step comprises directly exposing the first mixture to a source of oxygen.

9. The method of claim 7 wherein the oxygen is formed in situ.

10. The method of claim 9 wherein the oxygen is formed by a redox reaction.

11. The method of claim 10 wherein the exposing step comprises adding a reducing agent selected from the group consisting of tertiary, secondary, and primary phosphines; amines; hydrazines; hydroxyphenyl compounds; hydrogen; hydrides; metals; boranes; aldehydes; alcohols; thiols; reducing halides; and polyfunctional reductants.

12. The method of claim 7 wherein the exposing step comprises exposing a coordinating solvent to a source of oxygen and adding the exposed coordinating solvent to the mixture.

13. The method of claim 1 wherein the coordinating solvent is selected from the group consisting of amines, alkyl phosphines, alkyl phosphine oxides, fatty acids, ethers, furans, phospho-acids, pyridines, alkenes, alkynes and combinations thereof.

14. The method of claim 13 wherein the coordinating solvent is pure.

15. The method of claim 1 wherein the mixing step further includes mixing a ligand with the first precursor and coordinating solvent.

16. The method of claim 15 wherein the ligand is selected from the group consisting of phospho-acids, carboxylic acids, amines, amides, alcohols, ethers, alkenes, and alkynes.

17. The method of claim 16 wherein the ligand is a phosphonic acid.

18. The method of claim 17 wherein the phosphonic acid is selected from the group consisting of hexylphosphonic acid and tetradecylphosphonic acid.

19. The method of claim 1 wherein the coordinating solvent is a mixture of a non-coordinating solvent and a ligand.

20. The method of claim 19 wherein the non-coordinating solvent is an alkane.

21. The method of claim 19 wherein the ligand is selected from the group consisting of phospho-acids, carboxylic acids, amines, amides, alcohols, ethers, alkenes, and alkynes.

22. The method of claim 1 wherein the nanoparticles are semiconductive.

23. The method of claim 22 wherein the first precursor is selected from the group consisting of Group 2, 12, 13 and 14 element-containing compounds.

24. The method of claim 22 wherein the second precursor is selected from the group consisting of Groups 14, 15 and 16 element-containing compounds.

25. The method of claim 1 which further comprises producing a nanoparticle shell.

26. The method of claim 25 wherein the shell producing step comprises:
   (a') mixing the nanoparticles with at least one coordinating solvent to form a third mixture;
   (b') heating the third mixture to a temperature that is sufficiently high to form a shell on the nanoparticles when third and fourth precursors are added;
   (c') introducing third and fourth precursors into the third mixture after heating the third mixture form a fourth mixture thereby resulting in the formation of shells on a plurality of nanoparticles; and
   (d') cooling the third mixture to stop further growth of the shell; wherein the method further comprises exposing the third or fourth mixture to a reaction promoter selected from the group consisting of oxygen and a reducing agent.

27. The method of claim 26 wherein an additive or additive precursor is included in step (a').

28. A method of producing semiconductive nanoparticles having a valency "n", comprising:
   (a) mixing a first precursor having a valency "c" and at least one coordinating solvent to form a first mixture;
   (b) exposing the first mixture to a reaction promoter different from the coordinating solvent wherein the reaction promoter converts the valency of the first precursor to a valency "a";
   (c) heating the first mixture to a temperature that is sufficiently high to form nanoparticles when a second precursor is added;
   (d) introducing a second precursor into the first mixture, the first mixture comprising the first precursor with the valency "a", to form a second mixture thereby resulting in the formation of a plurality of nanoparticles; wherein the second precursor has a valency "b", and wherein a+b=n and c+b.≠n; and (e) cooling the second mixture to stop further growth of the nanoparticles.

29. The method of claim 28 wherein the reaction promoter is a reducing agent.

30. The method of claim 29 wherein the reaction promoter is a cathode.

31. The method of claim 30 wherein the cathode is made of a material selected from the group consisting of platinum, silver and carbon.

32. The method of claim 29 wherein the reducing agent is a chemical reducing agent selected from the group consisting of tertiary, secondary, and primary phosphines; amines; hydrazines; hydroxyphenyl compounds; hydrogen; hydrides; metals; boranes; aldehydes; alcohols; thiols; reducing halides; and polyfunctional reductants.

33. The method of claim 32 wherein the coordinating solvent is pure.

34. The method of claim 28 wherein the reaction promoter is a source of oxygen.

35. The method of claim 28 wherein the reaction promoter is oxygen that is formed in situ by a redox reaction.

36. The method of claim 35 wherein the exposing step comprises adding a reducing agent selected from the group consisting of tertiary, secondary, and primary phosphines; amines; hydrazines; hydroxyphenyl compounds; hydrogen; hydrides; metals; boranes; aldehydes; alcohols; thiols; reducing halides; and polyfunctional reductants.

37. The method of claim 28 wherein the step of heating the first mixture occurs prior to introducing the second precursor.

* * * * *

UNITED STATES PATENT AND TRADEMARK OFFICE
CERTIFICATE OF CORRECTION

PATENT NO. : 7,147,712 B2
APPLICATION NO. : 10/263366
DATED : December 12, 2006
INVENTOR(S) : Zehner et al.

Page 1 of 1

It is certified that error appears in the above-identified patent and that said Letters Patent is hereby corrected as shown below:

Column 21, line 15, delete the period "." and insert a colon --:-- in its place

Column 21, line 23, delete the word "heading" and insert --heating-- in its place Column 21, line 24, delete the word "of"

Column 22, line 45, insert the word --to-- directly before the word "form"

Signed and Sealed this

Twenty-seventh Day of February, 2007

JON W. DUDAS
*Director of the United States Patent and Trademark Office*